United States Patent
Tsai

(10) Patent No.: US 8,663,752 B2
(45) Date of Patent: Mar. 4, 2014

(54) MANUFACTURING METHOD OF CARBON COATED ALUMINUM FOIL AS CATHODE OF SOLID ALUMINUM ELECTROLYTIC CAPACITOR

(75) Inventor: Hung-Wen Tsai, Yunlin County (TW)

(73) Assignees: Jeng-Kuang Lin, New Taipei (TW); Chung-Yau Liau, Kaohsiung (TW); Hung-Wen Tsai, Yunlin County (TW)

( * ) Notice: Subject to any disclaimer, the term of this patent is extended or adjusted under 35 U.S.C. 154(b) by 162 days.

(21) Appl. No.: 13/046,915

(22) Filed: Mar. 14, 2011

(65) Prior Publication Data

US 2012/0237782 A1      Sep. 20, 2012

(51) Int. Cl.
H05H 1/24    (2006.01)
H05H 1/40    (2006.01)

(52) U.S. Cl.
USPC ............... 427/577; 427/535; 427/79; 427/81; 427/98.8

(58) Field of Classification Search
USPC .............................. 427/577, 535, 79, 81, 98.8
See application file for complete search history.

(56) References Cited

U.S. PATENT DOCUMENTS

| | | | |
|---|---|---|---|
| 4,778,058 A * | 10/1988 | Yamazaki et al. | 383/200 |
| 7,123,468 B2 * | 10/2006 | Kawashima et al. | 361/532 |
| 7,348,102 B2 * | 3/2008 | Li et al. | 429/233 |
| 2002/0080558 A1 * | 6/2002 | Nonaka et al. | 361/502 |
| 2006/0063072 A1 * | 3/2006 | Li et al. | 429/245 |
| 2006/0172134 A1 * | 8/2006 | Ro et al. | 428/408 |
| 2007/0019366 A1 * | 1/2007 | Yamaguchi et al. | 361/540 |
| 2008/0130202 A1 * | 6/2008 | Ro et al. | 361/516 |
| 2008/0254379 A1 * | 10/2008 | Iwanaga et al. | 430/66 |
| 2009/0004363 A1 * | 1/2009 | Keshner et al. | 427/8 |
| 2010/0128416 A1 * | 5/2010 | Hwang et al. | 361/529 |
| 2011/0027537 A1 * | 2/2011 | Inoue et al. | 428/172 |
| 2011/0159312 A1 * | 6/2011 | Tsubaki et al. | 428/606 |
| 2011/0182003 A1 * | 7/2011 | Oshima | 361/532 |

OTHER PUBLICATIONS

Lin, Chuen-Chang, et al., "Carbon Nanotubes Grown on Nanoporous Alumina Templates/Aluminum Foil for Electrodes of Aluminum Electrolytic Capacitors." Journal of the Electrochemical Society, 157 (2) A237-A241 (2010).*
Kavian, Reza, et al., "Growth of carbon nanotubes on aluminum foil for supercapacitor electrodes." J. Mater. Sci. (2011) 46: 1487-1493.*
Final Report for AOARD Grant AOARD-10-4155 "Carbon-coated current collectors for high-power Li-ion secondary batteries". Sep. 20, 2011, pp. 1-10.*

* cited by examiner

*Primary Examiner* — Bret Chen
(74) *Attorney, Agent, or Firm* — Rosenberg, Klein & Lee

(57) ABSTRACT

A method of manufacturing carbon coated aluminum foil as a cathode of solid aluminum electrolytic capacitors Comprising the steps of: preparing an aluminum foil by setting the aluminum foil into a chamber; roughening at least one surface of the aluminum foil by introducing gas into the chamber and activating an electric field so that the gas is ionized and turned into a plasma; and depositing carbon atoms by introducing gas mixed with carbon atoms and turning on the electric field again so as to make the carbon atoms have positive charge thereby impacting into and attaching firmly to the rough surface of the aluminum foil to form a carbon film.

4 Claims, 4 Drawing Sheets

MANUFACTURING METHOD OF CARBON COATED ALUMINUM FOIL AS CATHODE OF SOLID ALUMINUM ELECTROLYTIC CAPACITOR

BACKGROUND OF THE INVENTION

1. Field of the Invention

The present invention relates to a carbon coated aluminum foil as a cathode of solid aluminum electrolytic capacitors and a manufacturing method thereof, especially to a carbon coated aluminum foil as a cathode of solid aluminum electrolytic capacitors with good mechanical strength, high conductivity, high capacitance ratio, high power density and long use life and a manufacturing method thereof.

2. Description of Related Art

Capacitors are used for charge storage, blocking direct current, allowing alternating current to pass in filters, tuning and oscillation. Different capacitors have different features so that their functions and applications are different. Among the capacitors, due to higher electrostatic capacity and lower manufacturing cost, aluminum electrolytic capacitors are applied most broadly to telecommunication products and electronic products such as power supplies, motherboard, etc.

Generally, each aluminum electrolytic capacitor includes two electrodes, anode and cathode. The anode is made of metals such as aluminum, Tantalum, etc. on which an insulating oxide film is grown. As to the cathode, it's electrolyte with an aluminum foil having large surface and used as a cathode terminal so as to increase electrostatic capacitance of the capacitor. Moreover, the volume o the capacitor is minimized along with more compact size of the appliances. Thus the aluminum foil is much thinner and the mechanical strength of the aluminum foil in the capacitor is dramatically reduced. Therefore, the service life of the capacitor is further decreased.

Some people in the business have tried to coat a carbon layer on a surface of the aluminum foil so as to increase the strength of the aluminum foil. Refer to Taiwanese Pat. No I333221 "cathode foil for capacitor and method for manufacturing the same", aluminum foils are set in a space filled with hydrocarbons. A material containing carbon in slurry, liquid or solid state is produced by mixing carbon with binders, solvents or water. Then the material containing carbon is attached to the surface of the aluminum foils by coating or hot pressing and a carbon layer is formed on the surface of the aluminum foils.

Although the above Taiwanese patent can coat the material containing carbon on the surface of the aluminum foil, the carbon layer and the aluminum foil are connected only by binders or solvents. The carbon layer is easily falling away from the aluminum foil due to unstable connection between the carbon layer and the aluminum foil. Moreover, the binders/solvents reduce conductivity of the material containing carbon so that the electrical conductivity of the aluminum foil with the carbon layer is significantly reduced. This has negative effects on electrical conductivity, capacitance ratio, power density and use life of capacitors.

Furthermore, other patents such as Taiwanese Pub. App. No. 200423459 "aluminum coated with carbon and manufacturing method of the same", Taiwanese Pub. App. No. 200912038 "aluminum coated with carbon and manufacturing method of the same", and Taiwanese Pub. App. No. 201033405 "aluminum coated with carbon and manufacturing method of the same", all reveal aluminum coated with a carbon layer and related methods. These patents have shortcomings of poor conductivity, bad capacitance ratio, poor power density of capacitors resulted from poor adhesion between the carbon layer and the aluminum, complicated manufacturing processes, and high production cost. This is not cost effective.

Thus there is a need to develop a new structure of the carbon coated aluminum foil and a manufacturing method thereof that overcomes the above shortcomings.

SUMMARY OF THE INVENTION

Therefore it is a primary object of the present invention to provide a carbon coated aluminum foil as a cathode of solid aluminum electrolytic capacitors and a manufacturing method thereof that produce carbon coated aluminum foils with good mechanical strength and high electrical conductivity.

It is another object of the present invention to provide a carbon coated aluminum foil as a cathode of solid aluminum electrolytic capacitors and a manufacturing method thereof that perform the roughening and carbon deposition processes on surfaces of both sides of the aluminum foil at the same time so as to increase the manufacturing efficiency and further improve the production capacity as well as industrial competitiveness.

In order to achieve the above objects, a manufacturing method of a carbon coated aluminum foil as a cathode of solid aluminum electrolytic capacitors includes following steps:

A. preparing an aluminum foil by setting the aluminum foil into a vacuum chamber.

B. roughening the aluminum foil: gas is introduced into the vacuum chamber and an electric field is turned on so that the gas is ionized and turned into a plasma. Positive ions in the plasma move at high speed into the aluminum foil so that a surface of the aluminum foil is roughened to become a rough surface.

C. depositing carbon atoms: then another gas mixed with carbon atoms is introduced into the vacuum chamber and the electric field is turned on again to make the carbon atoms have positive charge. The carbon atoms with positive charge move toward the aluminum foil at high speed and the aluminum foil is set as a cathode. Thus the carbon atoms are mounted into and attached firmly to the rough surface of the aluminum foil so as to form a carbon film on the surface of the aluminum foil by sequential accumulation.

The carbon atom is firmly mounted on the surface of the aluminum foil due to the roughness of the surface. Moreover, the carbon film formed by bound carbons atoms has excellent adhesion and electrical conductivity. Thus not only mechanical strength of the aluminum foil is increased dramatically, electrical conductivity, capacitance ratio, power density and use life of capacitors are also improved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
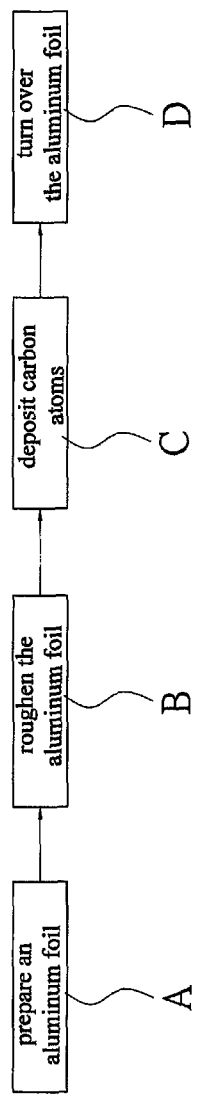
FIG. 1 is a flow chart of an embodiment according to the present invention.
Figure 2:
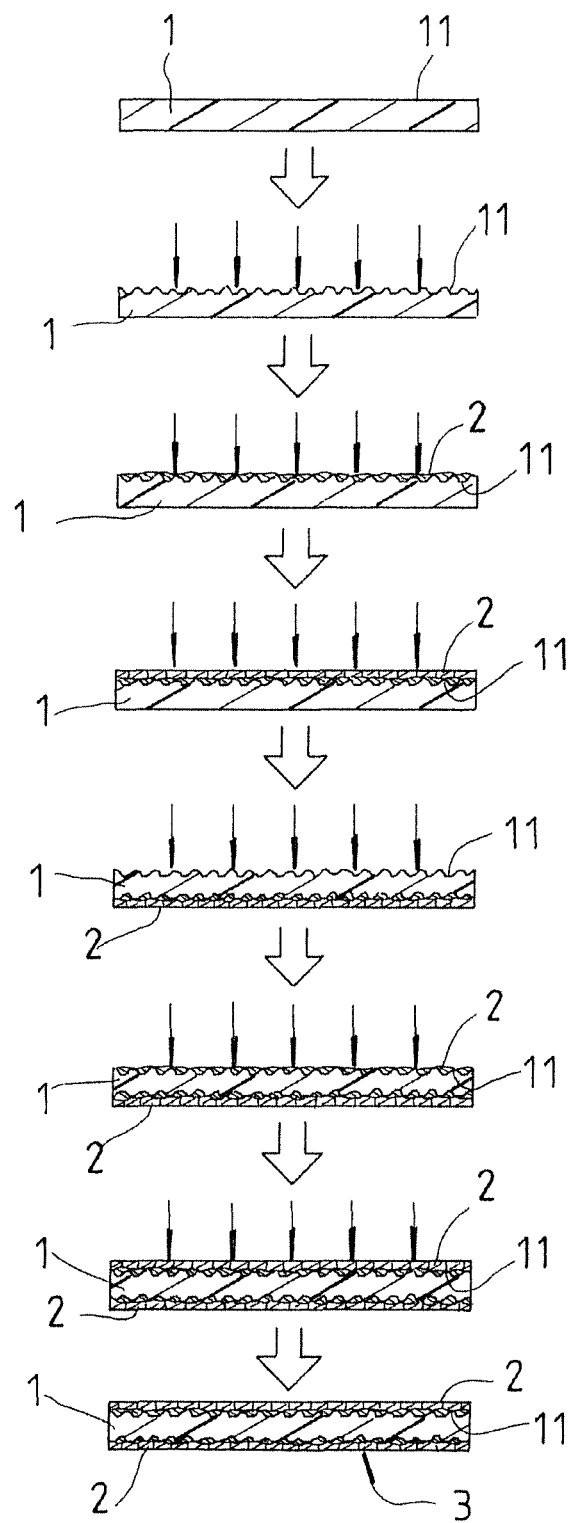
FIG. 2 is a schematic drawing showing steps of an embodiment according to the present invention.

Refer to FIG. 1 and FIG. 2, a carbon coated aluminum foil as a cathode of solid aluminum electrolytic capacitors and a manufacturing method are disclosed. The manufacturing method of a carbon coated aluminum foil as a cathode of solid aluminum electrolytic capacitors includes following steps:

A. prepare an aluminum foil: set an aluminum foil 1 into a vacuum chamber;

B. roughen the aluminum foil: introduce gas into the vacuum chamber and turn on an electric field so that the gas is ionized and turned into a plasma. Positive ions in the plasma move into the aluminum foil 1 at high speed and the aluminum foil 1 is used as a cathode. Thus a surface 11 on one side of the aluminum foil 1 facing upward is roughened to become a rough surface.

C. deposit carbon atoms: then another gas mixed with carbon atoms 2 is introduced into the vacuum chamber and the electric field is turned on again so as to make the carbon atoms 2 have positive charge. Under the guidance of a bundle of magnetic fields, the carbon atoms 2 with positive charge move toward the aluminum foil 1 at high speed. Thus the carbon atoms 2 are mounted into and attached firmly to the rough surface 11 of the aluminum foil 1. Due to the bundle of magnetic fields, the carbon atoms 2 are evenly attached to the surface 11 on one side of the aluminum foil 1, accumulated sequentially and bound to form two-dimensional layered structure or even three-dimensional carbon cluster film.

D. turn over the aluminum foil: turn the aluminum foil 1 over to the other side 1 thereof and repeat the above step B and step C so as to make a surface 11 on the other side of the aluminum foil 1 become a rough surface. Thus the carbon atoms 2 are attached to the other side 1 of the aluminum foil 1 evenly and accumulated to form a carbon cluster film. Thereby a carbon coated aluminum foil 3 whose surface is covered by carbon with high purity and with low resistivity is formed.

As to the carbon coated aluminum foil 3 produced by the present method, the carbon film and the aluminum foil 1 are connected firmly. Moreover, the carbon film is formed by the binding of carbon atoms 2 so that the carbon film itself has excellent adhesion, not easily peeled off. And the carbon film formed by pure carbon atoms is with good electrical conductivity. Therefore, the carbon coated aluminum foil 3 of the present invention not only increases mechanical strength of the aluminum foil 1 dramatically, the good electrical conductivity helps to improve electrical conductivity, capacitance ratio, power density and use life of the appliances and electronic produces assembled with the capacitors.

Figure 3:
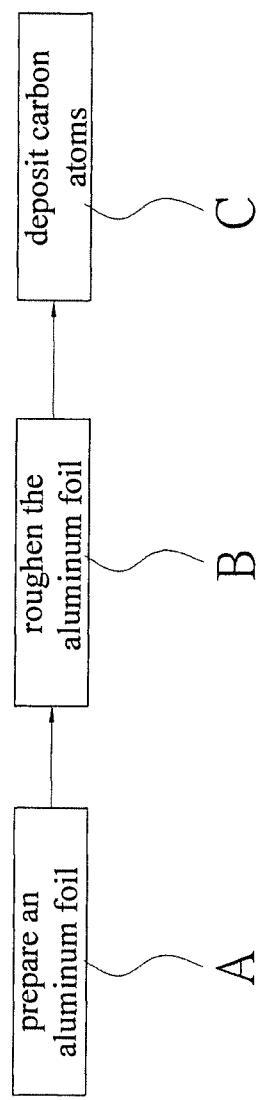
FIG. 3 is a flow chart of another embodiment according to the present invention.
Figure 4:
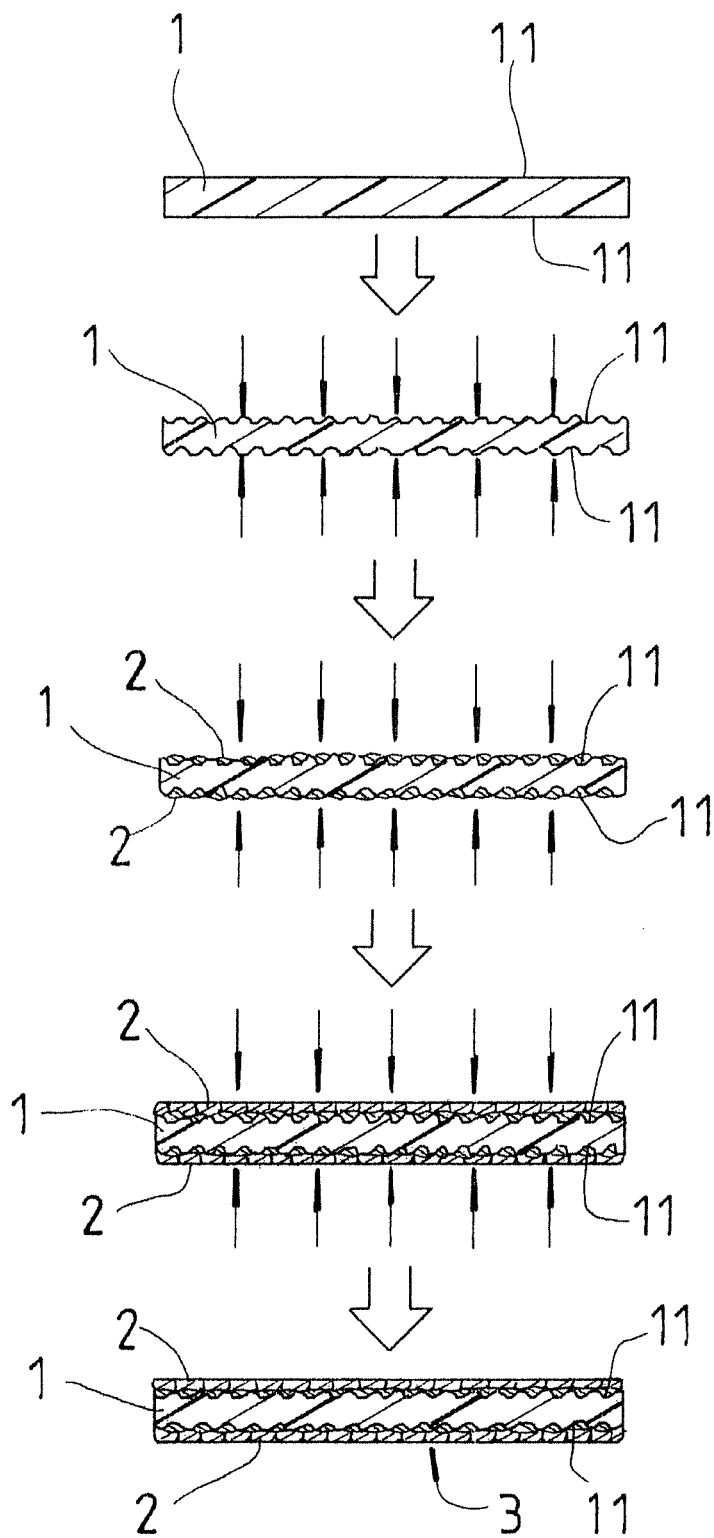
FIG. 4 is a schematic drawing showing steps of another embodiment according to the present invention.

Moreover, refer to FIG. 3 and FIG. 4, another embodiment of the present invention is revealed. The manufacturing method of this embodiment consists of following steps:

A. prepare an aluminum foil: set an aluminum foil 1 into a vacuum chamber;

B. roughen the aluminum foil: introduce gas into the vacuum chamber and activate an electric field so as to ionize the gas and turn the gas into a plasma. Positive ions in the plasma hit both surfaces 11 on two sides of the aluminum foil 1 cathode at high speed. Thus the surfaces 11 on two sides of the aluminum foil 1 bumped by ions are turned into rough surfaces at the same time.

C. deposit carbon atoms: then introduce another gas mixed with carbon atoms 2 into the vacuum chamber and the electric field is turned on again so that the carbon atoms 2 have positive charge. Under the guidance of a bundle of magnetic fields, the carbon atoms 2 with positive charge move at high speed toward the aluminum foil 1 to be mounted into and attached firmly to the surface 11 of the aluminum foil 1. Due to the bundle of magnetic fields, the carbon atoms 2 are evenly attached to the surface 11 on two sides of the aluminum foil 1, accumulated sequentially and bound to form carbon cluster film. The two sides of the aluminum foil 1 are processed simultaneously so that the production efficiency of the carbon coated aluminum foil is increased significantly. At the same time, the production capacity and industrial competitiveness are both improved dramatically.

In summary, the present invention has following advantages according to the above embodiments:

1. The carbon coated aluminum foil of the present invention is produced by roughening surfaces of the aluminum foil and mounting carbon atoms into the rough surfaces of the aluminum foil. Thus the carbon atoms are connected to the aluminum foil tightly and firmly, not easily peeling off from the surfaces of the aluminum foil. The mechanical strength of the aluminum foil is improved.

2. In the present invention, the carbon atoms form the carbon film on surfaces of the aluminum foil by sequential accumulation. The carbon film has good adhesion due to bonding between carbon atoms and good conductivity due to pure carbon atoms. Thus not only mechanical strength of the aluminum foil is increased dramatically, electrical conductivity, capacitance ratio, power density and use life of capacitors are also improved.

3. The manufacturing method of the present invention performs the roughening and carbon deposition processes on surfaces of both sides of the aluminum foil at the same time. Thus the manufacturing efficiency is increased. Therefore, both the production capacity and industrial competitiveness are improved significantly.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A manufacturing method of a carbon coated aluminum foil as a cathode of solid aluminum electrolytic capacitors comprising the steps of:

A. preparing an aluminum foil by setting the aluminum foil into a chamber;

B. roughening at least one surface of the aluminum foil by introducing gas into the chamber and activating an electric field so that the gas is ionized to form a plasma; positive ions in the plasma impinging against the aluminum foil that is set as a cathode of capacitors so that the surface on at least one side of the aluminum foil becomes a rough surface; and, C. depositing carbon atoms by introducing gas mixed with carbon atoms and turning on the electric field again so as to positively charge the carbon atoms, the carbon atoms with positive charge being propelled responsive to the electric field toward the aluminum foil to be embedded into the roughened surface of the aluminum foil for direct contact therewith, and accumulated on the roughened surface of the aluminum foil to form a carbon film thereon;

wherein the carbon atoms and the positive ions in the plasma are directed by a bundle of magnetic fields.

2. The method as claimed in claim 1, wherein the method having a further step of turning over the aluminum foil after the step of depositing carbon atoms; the aluminum foil is turned over, a surface on the other side of the aluminum foil is roughened and carbon atoms are accumulated sequentially to the surface on the other side of the aluminum foil to form a carbon film thereon because only the surface on one side of the aluminum foil is coated with the carbon film.

3. The method as claimed in claim 1, wherein the surface on each of two sides of the aluminum foil is roughened at the same time and the carbon atoms are accumulated sequentially to the surface on both sides of the aluminum foil simultaneously to form a carbon film on each of two sides of the aluminum foil.

4. The method as claimed in claim 1, wherein the chamber is a vacuum chamber.

* * * * *